United States Patent
Kurosaki et al.

(10) Patent No.: US 10,149,053 B2
(45) Date of Patent: Dec. 4, 2018

(54) SIGNAL PROCESSING DEVICE, SIGNAL PROCESSING METHOD, AND SPEAKER DEVICE

(71) Applicant: Onkyo Corporation, Osaka (JP)

(72) Inventors: Hiroki Kurosaki, Osaka (JP); Tsuyoshi Kawaguchi, Osaka (JP); Yoshinori Nakanishi, Osaka (JP); Hiroyuki Asahara, Osaka (JP); Norimasa Kitagawa, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 15/657,142

(22) Filed: Jul. 22, 2017

(65) Prior Publication Data

US 2018/0041836 A1 Feb. 8, 2018

(30) Foreign Application Priority Data

Aug. 5, 2016 (JP) .................................. 2016-154510
Jun. 2, 2017 (JP) .................................. 2017-109652

(51) Int. Cl.
*H04R 3/04* (2006.01)
*H03G 3/30* (2006.01)
(Continued)

(52) U.S. Cl.
CPC ............. *H04R 3/04* (2013.01); *H03G 3/3005* (2013.01); *H03G 5/165* (2013.01); *H03G 9/025* (2013.01);
(Continued)

(58) Field of Classification Search
CPC ............ H03G 9/00; H03G 9/02; H03G 5/165; H03G 3/3305; H03G 7/00; H03G 7/002; H04S 1/007; H04R 3/04
(Continued)

(56) References Cited

U.S. PATENT DOCUMENTS

2007/0242837 A1* 10/2007 Glen ...................... H03G 9/005
381/101
2011/0255712 A1* 10/2011 Urata ..................... H03G 9/005
381/107
(Continued)

FOREIGN PATENT DOCUMENTS

EP          2522156 A1    11/2012
JP        2006-340328    12/2006
(Continued)

*Primary Examiner* — William A Jerez Lora
(74) *Attorney, Agent, or Firm* — Renner Otto Boisselle & Sklar, LLP

(57) ABSTRACT

To resolve volume shortage of middle and high band of speaker reproduction sound. A DSP 4 performs LPF processing to extract low frequency component of an audio signal to which the first volume processing is performed, DRC processing to compress the audio signal to which the LPF processing is performed in case that the audio signal to which the LPF processing is performed is not less than a predetermined signal level, HPF processing to extract high frequency component of the audio signal to which the first volume processing is performed, second volume processing to attenuate the audio signal to which the HPF processing is performed based on the volume value that is received, and synthesis processing to synthesize the audio signal to which the DRC processing is performed and the audio signal to which the second volume processing is performed.

14 Claims, 13 Drawing Sheets

(51) Int. Cl.
 *H03G 5/16* (2006.01)
 *H04S 1/00* (2006.01)
 *H03G 9/02* (2006.01)
 *H04R 3/00* (2006.01)

(52) U.S. Cl.
 CPC ............... *H04R 3/00* (2013.01); *H04S 1/007* (2013.01); *H04R 2430/01* (2013.01); *H04R 2430/03* (2013.01)

(58) Field of Classification Search
 USPC .......................................... 381/99, 303, 320
 See application file for complete search history.

(56) References Cited

U.S. PATENT DOCUMENTS

| | | | |
|---|---|---|---|
| 2011/0280407 A1* | 11/2011 | Skinner | H03G 3/3005 381/28 |
| 2012/0189131 A1 | 7/2012 | Ueno et al. | |
| 2015/0373454 A1* | 12/2015 | Shidoji | G10L 21/013 381/98 |
| 2018/0041836 A1* | 2/2018 | Kurosaki | H03G 3/3005 |

FOREIGN PATENT DOCUMENTS

| | | |
|---|---|---|
| JP | 2007-104407 | 4/2007 |
| WO | WO 2006/018808 | 2/2006 |

* cited by examiner

Fig. 3

| MASTER VOLUME [dB] | VOLUME [dB] |
|---|---|
| − | − |
| − | − |
| − | − |
| − | − |
| − | − |
| − | − |
| 0 (MAXIMUM) | 0 |
| −1 | −1 |
| −2 | −2 |
| −3 | −3 |
| −4 | −4 |
| −5 | −5 |
| −6 | −6 |
| ... | ... |

Fig. 4

| MASTER VOLUME [dB] | FIRST VOLUME [dB] | SECOND VOLUME [dB] |
|---|---|---|
| +6 (MAXIMUM) | 0 | 0 |
| +5 | 0 | -1 |
| +4 | 0 | -2 |
| +3 | 0 | -3 |
| +2 | 0 | -4 |
| +1 | 0 | -5 |
| 0 | 0 | -6 |
| -1 | -1 | -6 |
| -2 | -2 | -6 |
| -3 | -3 | -6 |
| -4 | -4 | -6 |
| -5 | -5 | -6 |
| -6 | -6 | -6 |
| ... | ... | ... |

SIGNAL PROCESSING DEVICE, SIGNAL PROCESSING METHOD, AND SPEAKER DEVICE

BACKGROUND OF THE INVENTION

1. Field of the Invention

The present invention relates to a signal processing device that performs signal processing to an audio signal, a signal processing method, and a speaker device that includes the signal processing device.

2. Description of the Related Art

A speaker device that outputs audio includes a signal processing device (for example, DSP (Digital Signal Processor) that performs signal processing to an audio signal. In the speaker device that includes a small diameter speaker, there is a case where the audio signal is compressed by the signal processing device because distortion component is included in output audio by excess amplitude of a speaker diaphragm remarkably or failure of speaker reproducing audio that abnormal sound occurs in output audio is suppressed. FIG. 12 is a graph illustrating compression proceeding by the signal processing device. A horizontal axis illustrates input. A vertical axis illustrates output. For example, in case that threshold is set to threshold 1 illustrated in FIG. 12, the audio signal that excesses threshold 1 is compressed. Further, in case that threshold is set to threshold 2 illustrated in FIG. 12, the audio signal that excesses threshold 2 is compressed.

Herein, as result of earnest research, in the audio signal, inventors discovers that amplitude of the speaker diaphragm becomes large and the speaker reproducing audio fails immediately even if input voltage is low in low frequency. Amplitude of the speaker diaphragm becomes large in low frequency which is not more than lowest resonance frequency f0 that reproduction sound pressure level becomes high in higher frequency. For this reason, when the audio signal level leading to limit of amplitude of the speaker diaphragm (hereinafter refereed as to "failure point") is set to threshold of compressing processing, the signal is compressed in surplus in middle and high frequency. Therefore, the inventors have found out that the other band is not compressed wastefully and volume can be added if compressing processing is performed to low frequency component of the audio signal. In JP 2007-104407 A, volume sense is tried to be increased by performing compressing processing to the audio signal to which low pass filter processing that extracts low frequency component of the audio signal is performed.

Further, in the speaker device, there are cases where low frequency equalizing processing to boost the low frequency component of the audio signal to extend frequency characteristics of the speaker to low frequency is performed as illustrated in FIG. 13.

In case that the above described low equalizing processing is performed, it is necessary to attenuate the audio signal so that amplitude of the speaker diaphragm does not reach failure point. However, when all band of the audio signal is attenuated, volume of middle and high frequency of the audio signal is short in reproduction sound from the speaker.

SUMMARY OF THE INVENTION

An objective of the present invention is to resolve volume shortage of middle and high band of speaker reproduction sound.

A signal processing device of the present invention performing: first volume processing to attenuate an audio signal based on a volume value that is received, lowpass filter processing to extract low frequency component of the audio signal to which the first volume processing is performed, compression processing to compress the audio signal to which the lowpass filter processing is performed in case that the audio signal to which the low pass filter processing is performed is not less than a predetermined signal level, highpass filter processing to extract high frequency component of the audio signal to which the first volume processing is performed, second volume processing to attenuate the audio signal to which the high pass filter processing is performed based on the volume value that is received, and synthesis processing to synthesize the audio signal to which the compression processing is performed and the audio signal to which the second volume processing is performed.

In the present invention, a signal processing device performs compression processing to compress an audio signal to which a low pass filter processing is performed in case that the audio signal to which the low pass filter processing is performed is not less than a predetermined signal level. Thus, volume shortage of middle and high band can be resolved because middle and high frequency of the audio signal is not compressed wastefully.

Low frequency component of the audio signal is compressed in case of not less than a predetermined signal level so that amplitude of a speaker diaphragm does not reach failure point. However, the middle and high frequency component is not a signal level to reach failure point even if attenuation amount by a first volume processing to attenuate all band component of the audio signal based on volume value that is received is zero. In the present invention, the signal processing device performs second volume processing to attenuate the audio signal to which high pass filter processing is performed based on volume value that is received. Therefore, volume shortage of middle and high frequency can be resolved because volume of middle and high frequency component of the audio signal can be risen (attenuation amount can be decreased).

Preferably, wherein attenuation amount by the first volume processing changes and attenuation amount by the second volume processing is constant in case that the volume value that is received is not more than a predetermined value, and the attenuation amount by the first volume processing is zero and the attenuation amount by the second volume processing changes in case that the volume value that is received exceeds the predetermined value.

In the present invention, attenuation amount by first volume processing is zero and the attenuation amount by the second volume processing changes in case that the volume value that is received exceeds a predetermined value. Therefore, middle and high frequency component can be risen (attenuation amount can be decreased) by the second volume processing even if attenuation amount by the first volume processing becomes zero.

A signal processing device performing of the present invention: first volume processing to attenuate an audio signal based on a volume value that is received, lowpass filter processing to extract low frequency component of the audio signal to which the first volume processing is performed, compression processing to compress the audio signal to which the lowpass filter processing is performed in case that the audio signal to which the low pass filter processing is performed is not less than a predetermined signal level, highpass filter processing to extract high frequency component of the audio signal to which the first volume processing is performed, band pass filter processing to extract frequency band component between the low frequency component and the high frequency component of the audio signal to which the first volume processing is performed, second volume processing to attenuate the audio signal to which the band pass filter processing is performed based on the volume value that is received, third volume processing to attenuate the audio signal to which the high pass filter processing is performed based on the volume value that is received, and synthesis processing to synthesize the audio signal to which the compression processing is performed and the audio signal to which the second volume processing is performed.

In the present invention, a signal processing device performs compression processing to compress an audio signal to which a low pass filter processing is performed in case that the audio signal to which the low pass filter processing is performed is not less than a predetermined signal value. Thus, volume shortage of middle and high band can be resolved because middle and high frequency component of the audio signal is not compressed wastefully.

Low frequency component of the audio signal is compressed in case of not less than a predetermined signal level so that amplitude of a speaker diaphragm does not reach failure point. However, the middle and high frequency component of the audio signal is not signal level to reach failure point even if attenuation amount by first volume processing to attenuate all band component of the audio signal based on volume value that is received is zero. In the present invention, the signal processing device performs second volume processing to attenuate the audio signal to which band pass filter processing is performed based on volume value that is received. Further, the signal processing device performs third volume processing to attenuate the audio signal to which high pass filter processing is performed based on the volume value that is received. Therefore, volume shortage of middle and high frequency can be resolved because volume of middle and high frequency component of the audio signal can be risen (attenuation amount can be decreased).

Preferably, wherein attenuation amount by the first volume processing changes and attenuation amount by the second volume processing and the third volume processing is constant in case that the volume value that is received is not more than the predetermined value, and the attenuation amount by the first volume processing is zero and the attenuation amount by the second volume processing and the third volume processing changes in case that the volume value that is received exceeds the predetermined value.

In the present invention, attenuation amount by the first volume processing is zero and the attenuation amount by the second volume processing and the third volume processing change in case that the volume value that is received exceeds the predetermined value. Therefore, the volume of the middle and high frequency component can be risen (attenuation amount can be decreased) by the second volume processing and the third volume processing even if attenuation amount by the first volume processing becomes zero.

Preferably, further performing: low frequency equalizing processing to boost the low frequency component of the audio signal to which the low pass filter processing is performed, and the compression processing to the audio signal to which the low frequency equalizing processing is performed.

In the present invention, the signal processing device performs low frequency equalizing processing to boost the low frequency component of the audio signal to which the low pass filter processing is performed. Thus, frequency characteristics of a speaker can be extended to low frequency.

Preferably, further performing: attenuation processing to attenuate the audio signal to which the low pass filter processing is performed, and the low frequency equalizing processing to the audio signal to which the attenuation processing is performed.

In the present invention, the signal processing device performs attenuation processing to attenuate the audio signal to which the low pass filter processing is performed. Thus, there can be margin in the middle and high frequency component of the audio signal compared with case where all band frequency component of the audio signal is attenuated because only the low frequency component of the audio signal is attenuated for the low frequency equalizing processing. Therefore, in the second volume processing, volume can be risen with a predetermined attenuation amount.

Preferably, wherein attenuation amount by the attenuation processing is equal to value of difference of the attenuation amount by the first volume processing and the attenuation amount by the second volume processing in case where the volume value that is received is the predetermined value.

In the present invention, attenuation amount by the attenuation processing is equal to a value of difference of the attenuation amount by the first volume processing and the attenuation amount by the second volume processing in case where the volume value that is received is the predetermined value. Thus, in case that the volume value that is received changes beyond the predetermined value, audio that the low frequency component and the middle and high frequency is balanced can be reproduced.

Preferably, further performing: speaker adjustment equalizing processing to adjust frequency characteristics of the audio signal based on characteristics of a speaker, and the first volume processing to the audio signal to which the speaker adjustment equalizing processing is performed.

In the present invention, the signal processing device performs speaker adjustment equalizing to adjust frequency characteristics of the audio signal based on characteristics of a speaker. Thus, frequency characteristics can be set based on characteristics of the speaker.

Preferably, wherein in the first volume processing, a left and light audio signal is attenuated based on the volume value that is received, further performing: monaural synthesis processing to synthesize a left audio signal to which the first volume processing is performed that is multiplied by 0.5 and a right audio signal to which the first volume processing is performed that is multiplied by 0.5, in the low pass filter processing, low frequency component of an audio signal to which the monaural synthesis processing is performed is extracted, in the compression processing, the audio signal to which the lowpass filter processing is performed is compressed in case that the audio signal to which the low pass filter processing is performed is not less than a predetermined signal level, in the high pass filter processing, high frequency component of the left and right audio signals to which the first volume processing is performed is extracted, in the band pass filter processing, frequency band component between the low frequency component and the high frequency component of the left and right audio signals to which the first volume processing is performed is extracted, in the second volume processing, the left and right audio signals to which the band pass filter processing is performed are attenuated based on the volume value that is received, in the third volume processing, the left and right audio signals to which the high pass filter processing is performed are attenuated based on the volume value that is received, and in the synthesis processing, the audio signal to which the compression processing is performed and a left audio signal to which the second volume processing is performed are synthesized and the audio signal to which the compression processing is performed and a right audio signal to which the second volume processing is performed are synthesized.

In the present invention, the low pass filter processing is performed to the audio signal that synthesizes the left audio signal to which the first volume processing is performed that is multiplied by 0.5 and the right signal to which the first volume processing is performed that is multiplied by 0.5. Namely, low frequency component of the monauralized audio signal is extracted. Further, the low frequency component of the audio signal and predetermined frequency band component of the left audio signal are synthesized, and the low frequency component of the audio signal and predetermined frequency band component of the right audio signal are synthesized. By outputting the synthesized audio signal to two woofers and outputting the high frequency component of the left and right audio signal to respective tweeters, the audio signal not less than predetermined frequency is stereo and the audio signal not more than predetermined frequency is monauralized. For this reason, volume sense of low sound can be secured, burden of each unit/ amplifier can be spread, and stereo sense can be obtained. Like this, according to the present invention, volume sense and stereo sense can be compatible.

Preferably, wherein the left and right audio signals to which the third volume processing is performed are output to tweeters respectively, and the audio signal to which the synthesis processing is performed is output to two woofers.

A speaker device of the present invention comprising: the signal processing device and a speaker into which the audio signal from the signal processing device is input.

A signal processing method of the present invention performing: first volume processing to attenuate an audio signal based on a volume value that is received, lowpass filter processing to extract low frequency component of the audio signal to which the first volume processing is performed, compression processing to compress the audio signal to which the lowpass filter processing is performed in case that the audio signal to which the low pass filter processing is performed is not less than a predetermined signal level, highpass filter processing to extract high frequency component of the audio signal to which the first volume processing is performed, second volume processing to attenuate the audio signal to which the high pass filter processing is performed based on the volume value that is received, and synthesis processing to synthesize the audio signal to which the compression processing is performed and the audio signal to which the second volume processing is performed.

A signal processing method of the present invention performing: first volume processing to attenuate an audio signal based on a volume value that is received, lowpass filter processing to extract low frequency component of the audio signal to which the first volume processing is performed, compression processing to compress the audio signal to which the lowpass filter processing is performed in case that the audio signal to which the low pass filter processing is performed is not less than a predetermined signal level, highpass filter processing to extract high frequency component of the audio signal to which the first volume processing is performed, band pass filter processing to extract frequency band component between the low frequency component and the high frequency component of the audio signal to which the first volume processing is performed, second volume processing to attenuate the audio signal to which the band pass filter processing is performed based on the volume value that is received, third volume processing to attenuate the audio signal to which the high pass filter processing is performed based on the volume value that is received, and synthesis processing to synthesize the audio signal to which the compression processing is performed and the audio signal to which the second volume processing is performed.

Preferably, wherein in the first volume processing, left and light audio signals are attenuated based on the volume value that is received, further performing: monaural synthesis processing to synthesize a left audio signal to which the first volume processing is performed that is multiplied by 0.5 and a right audio signal to which the first volume processing is performed that is multiplied by 0.5, in the low pass filter processing, low frequency component of an audio signal to which the monaural synthesis processing is performed is extracted, in the compression processing, the audio signal to which the lowpass filter processing is performed is compressed in case that the audio signal to which the low pass filter processing is performed is not less than a predetermined signal level, in the high pass filter processing, high frequency component of the left and right audio signals to which the first volume processing is performed is extracted, in the band pass filter processing, frequency band component between the low frequency component and the high frequency component of the left and right audio signals to which the first volume processing is performed is extracted, in the second volume processing, the left and right audio signals to which the band pass filter processing is performed are attenuated based on the volume value that is received, in the third volume processing, the left and right audio signals to which the high pass filter processing is performed are attenuated based on the volume value that is received, and in the synthesis processing, the audio signal to which the compression processing is performed and a left audio signal to which the second volume processing is performed are synthesized and the audio signal to which the compression processing is performed and a right audio signal to which the second volume processing is performed are synthesized.

According to the present invention, volume shortage of middle and high band of speaker reproduction sound can be resolved.

BRIEF DESCRIPTION OF THE DRAWINGS

FIG. 3 is a diagram illustrating conventional volume processing.

FIG. 4 is a diagram illustrating relationship between first volume processing and second volume processing.

DETAILED DESCRIPTION OF THE PREFERRED EMBODIMENTS

Figure 1:
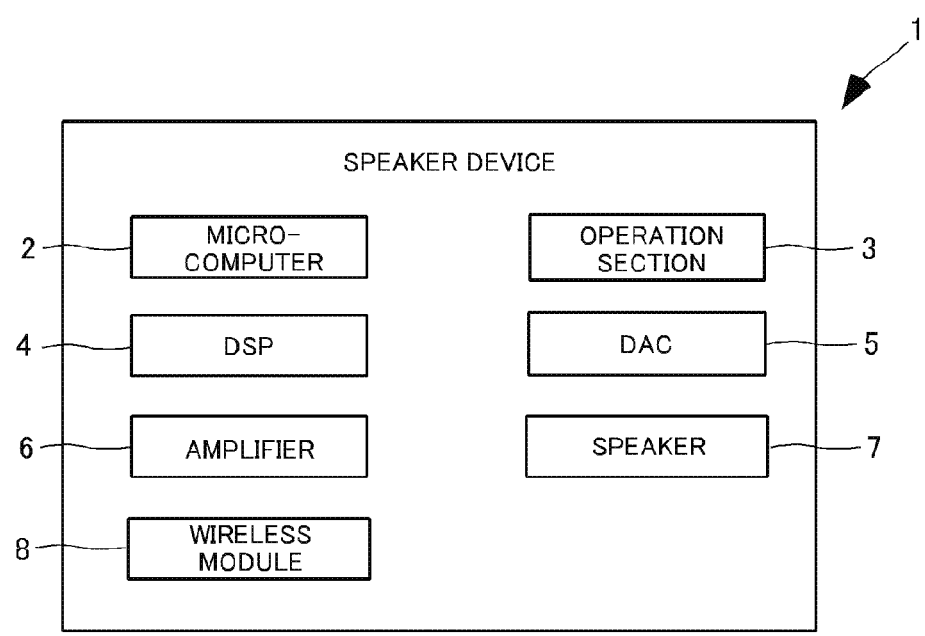
FIG. 1 is a block diagram illustrating a constitution of a speaker device according to an embodiment of the present invention.

An embodiment of the present invention is described below. FIG. 1 is a diagram illustrating a speaker device according to an embodiment of the present invention. The speaker device 1 includes a microcomputer 2, an operation section 3, a DSP (Digital Signal Processor) 4, a D/A converter (hereinafter, referred as to "DAC") 5, an amplifier 6, a speaker 7, and a wireless module 8.

The microcomputer 2 controls respective sections composing the speaker device 1. The operation section 3 has operation keys for receiving various settings. For example, the operation section 3 has a volume knob for receiving volume adjustment by a user. The DSP 4 (signal processing device) performs signal processing to a digital audio signal. Signal processing that the DSP 4 performs will be described later. The DAC 5 D/A-converts the digital audio signal to which the DSP 4 performs signal processing into an analog audio signal. The amplifier 6 amplifies the analog audio signal that is D/A-converted by the DAC 5. The analog audio signal that the amplifier 6 amplifies is output to the speaker 7. The speaker 7 outputs an audio based on the analog audio signal that is input. The wireless module 8 is for performing wireless communication according to Bluetooth (registered trademark) standard and Wi-Fi standard.

For example, the microcomputer 2 receives the digital audio signal that is sent from a smart phone, a digital audio player or the like via the wireless module 10. And, the microcomputer 2 makes the DSP 4 perform signal processing to the received digital audio signal.

First Embodiment

Figure 2:
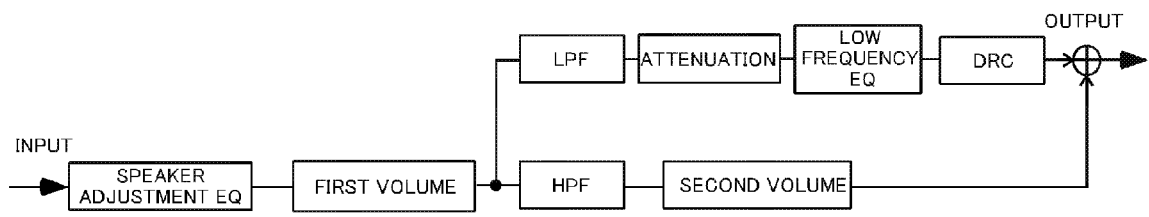
FIG. 2 is a diagram illustrating signal processing by a DSP in a first embodiment.

In a first embodiment, the speaker 7 is a full range speaker. FIG. 2 is a diagram illustrating signal processing by the DSP in the first embodiment. The DSP 4 performs speaker adjustment equalizing processing (hereinafter referred as to "speaker adjustment EQ processing"), first volume processing, low pass filter processing (hereinafter referred as to "LPF processing"), attenuation processing, low frequency equalizing processing (hereinafter referred as to "low frequency EQ processing"), dynamic range control processing (hereinafter referred as to "DRC processing"), high pass filter processing (hereinafter referred as to "HPF processing"), second volume processing, and synthesis processing.

The speaker adjustment EQ processing is processing to adjust frequency characteristics of an audio signal based on characteristics of a speaker. The DSP 4 performs the speaker adjustment EQ processing to the audio signal to which is input. The first volume processing is processing to attenuate the audio signal based on volume value that is received by the microcomputer 2. The DSP 4 performs the first volume processing to the audio signal to which the speaker adjustment EQ processing is performed. Therefore, the first volume processing is performed to all band component of the audio signal. The microcomputer 2 receives direction of volume value by a user via the operation section 3.

The LPF processing is processing to extract low frequency component (for example, not more than 150 Hz) of the audio signal. The DSP 4 performs the LPF processing to the audio signal to which the first volume processing is performed. It is preferable that frequency that is extracted by the LPF processing is set to include lowest resonance frequency f0 of the speaker. The attenuation processing is processing to attenuate the audio signal. The DSP 4 performs the attenuation processing to the audio signal to which the LPF processing is performed. The low frequency EQ processing is processing to boost low frequency component of the audio signal. The DSP 4 performs the low frequency EQ processing to the audio signal to which the attenuation processing is performed. The DRC processing (compression processing) is processing to compress the audio signal in case that the audio signal is not less than a predetermined signal level. The DSP 4 performs the DRC processing to the audio signal to which the low frequency EQ processing is performed.

The HPF processing is processing to extract high frequency component (for example, not less than 150 Hz) of the audio signal. The DSP 4 performs the HPF processing to the audio signal to which the first volume processing is performed. The second volume processing is processing to attenuate the audio signal based on volume value that is received by the microcomputer 2. The DSP 4 performs the second volume processing to the audio signal to which the HPF processing is performed. The synthesis processing is processing to synthesize the audio signal to which the DRC processing is performed and the audio signal to which the second volume processing is performed. The DSP 4 performs the synthesis processing to the audio signal to which the DRC processing is performed and the audio signal to which the second volume processing is performed.

FIG. 3 is a diagram illustrating conventional volume processing that is one volume processing. In the volume processing, all band of an audio signal is attenuated. In the conventional processing, volume sense of middle and high frequency is insufficient because volume processing to attenuate all band component of the audio signal is one.

FIG. 4 is a diagram illustrating relationship between the first volume processing and the second volume processing. "Master volume" is volume value that the microcomputer 2 receives. "First volume" is attenuation amount by the first volume processing. "Second volume" is attenuation amount by the second volume processing. In case that "master volume" is not more than "0 dB" (a predetermined value), attenuation amount by the second volume processing is constant "−6 dB". In case that "master volume" is not more than "0 dB", attenuation amount by the first volume processing changes. In case that "master volume" exceeds "0 dB", attenuation is not performed by the first volume processing (attenuation amount 0). In case that "master volume" exceeds "0 dB", attenuation amount by the second volume processing changes. In the present embodiment, even if attenuation amount by the first volume processing becomes "0 dB", volume of middle and high frequency component of the audio signal can be risen (attenuation amount is decreased) by the second volume processing.

Further, up to now, to perform the low frequency EQ processing, all band of the audio signal is attenuated. Like the present embodiment, the attenuation processing is performed to only the low frequency component of the audio signal, a predetermined attenuation amount margin exists in middle and high frequency of the audio signal compared with a conventional device. Therefore, volume can be risen with the predetermined attenuation amount in the second volume processing. Further, it is preferable that attenuation amount by the attenuation processing is value of difference of attenuation amount "0 dB" by the first volume processing and attenuation amount "−6 dB" by the second volume processing in case where "master volume" is "0 dB". In case that "master volume" changes beyond "0 dB", audio that low frequency component and middle and high frequency is balanced can be reproduced.

Figure 5:
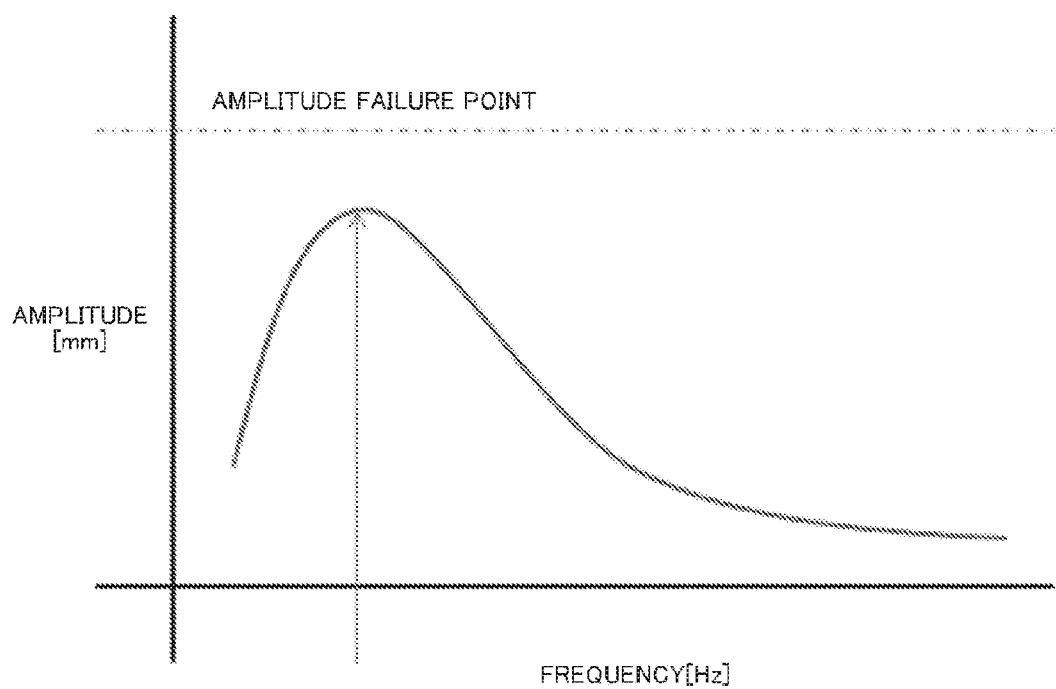
FIG. 5 is a diagram illustrating amplitude of a speaker diaphragm against frequency of an audio signal to which low frequency EQ processing is performed.
Figure 6:
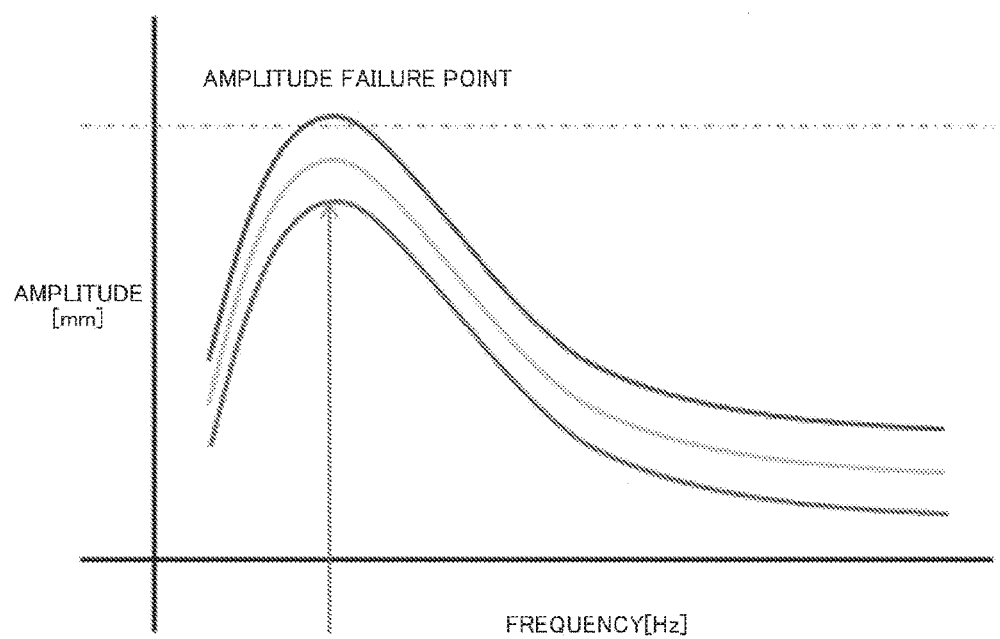
FIG. 6 is a diagram illustrating state that volume is risen from state of FIG. 5.

FIG. 5 is a diagram illustrating amplitude of a speaker diaphragm against frequency of the audio signal to which the low frequency EQ processing is performed. As illustrated in FIG. 5, in the low frequency EQ processing, low frequency component of the audio signal is boosted with a predetermined frequency as boost point. FIG. 6 is a diagram illustrating state that volume is risen from state of FIG. 5. As illustrated in FIG. 6, when volume is risen, low frequency component of the audio signal reaches amplitude that failure sound outputs and distortion increases greatly.

Figure 7:
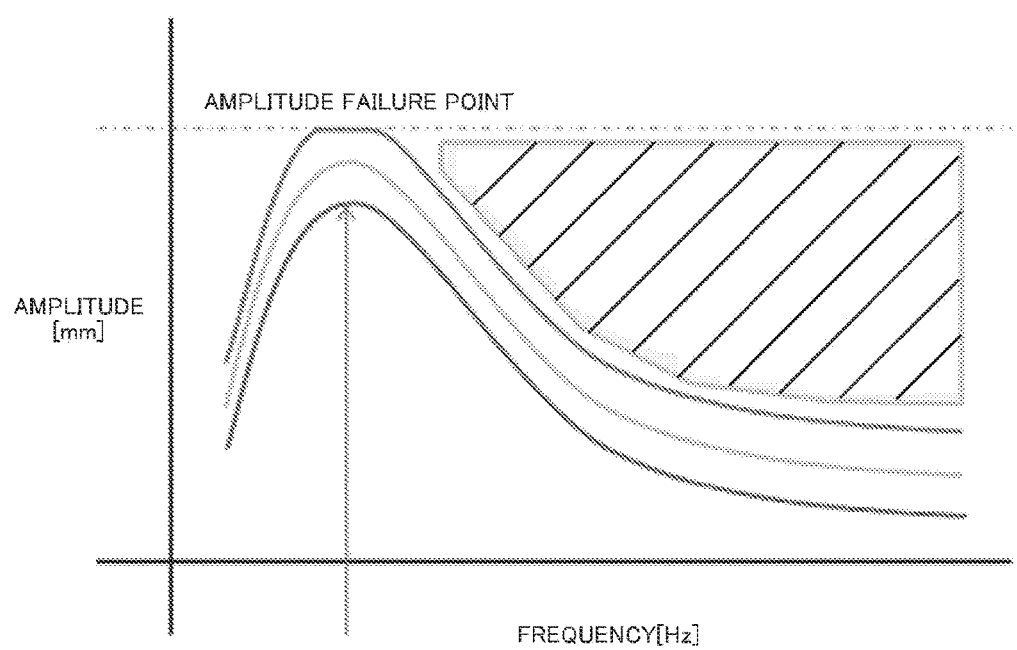
FIG. 7 is a diagram illustrating an audio signal to which DRC processing is performed.
Figure 8:
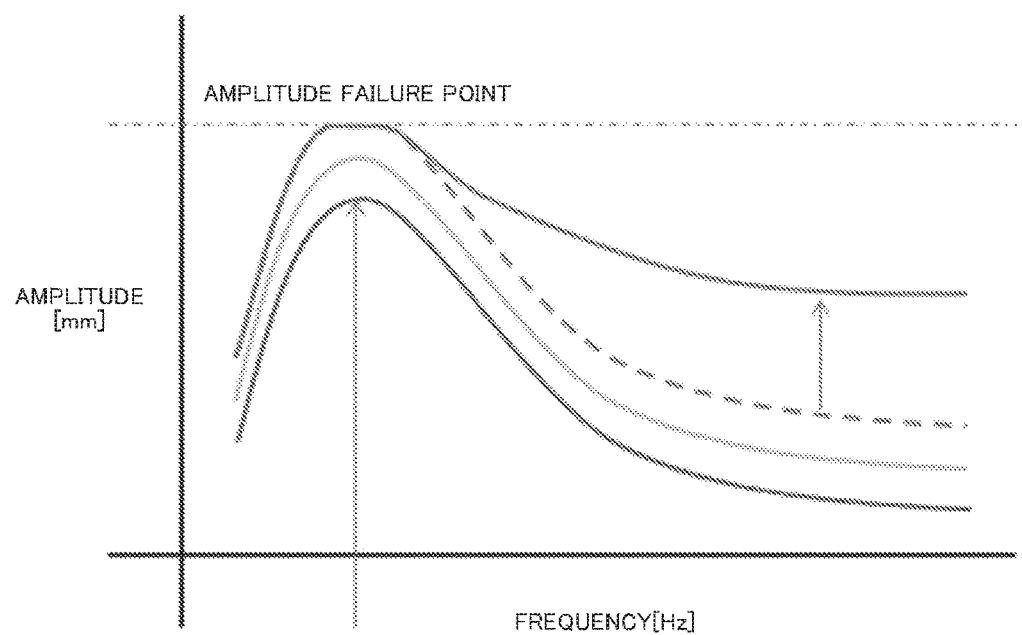
FIG. 8 is a diagram illustrating addition of volume by the second volume processing.

FIG. 7 is a diagram illustrating an audio signal to which the DRC processing is performed. As illustrated in FIG. 7, failure is prevented because low frequency component of the audio signal is compressed by the DRC processing. However, at point that low frequency component becomes 0 dBFS, amplitude of middle and high frequency (shaded area in FIG. 7) is small and volume is insufficient. In other words, in middle and high frequency, despite being able to produce volume, it is limited. FIG. 8 is a diagram illustrating addition of volume by the second volume processing. As illustrated in FIG. 8, volume of middle and high frequency component can be increased by the second volume processing.

As described above, in the present embodiment, the DSP 4 performs the DRC processing to compress the audio signal to which the LPF processing is performed in case that the audio signal to which the LPF processing is performed is not less than the predetermined signal value. Thus, volume shortage of middle and high band can be resolved because middle and high frequency of the audio signal is not compressed wastefully.

Low frequency component of the audio signal is compressed in case of not less than a predetermined signal level so that amplitude of a speaker diaphragm does not reach failure point. However, the middle and high frequency component of the audio signal is not a signal level to reach failure point even if attenuation amount by the first volume processing to attenuate all band component of the audio signal based on volume value that is received is zero. In the present embodiment, the DSP 4 performs the second volume processing to attenuate the audio signal to which the HPF processing is performed based on volume value that is received. Therefore, volume shortage of middle and high frequency can be resolved because volume of middle and high frequency component of the audio signal can be risen (attenuation amount can be decreased).

Further, in the present embodiment, attenuation amount by the first volume processing is zero and the attenuation amount by the second volume processing changes in case that the volume value that is received exceeds a predetermined value. Therefore, middle and high frequency component of the audio signal can be risen (attenuation amount can be decreased) by the second volume processing even if attenuation amount by the first volume processing becomes zero.

Second Embodiment

Figure 9:
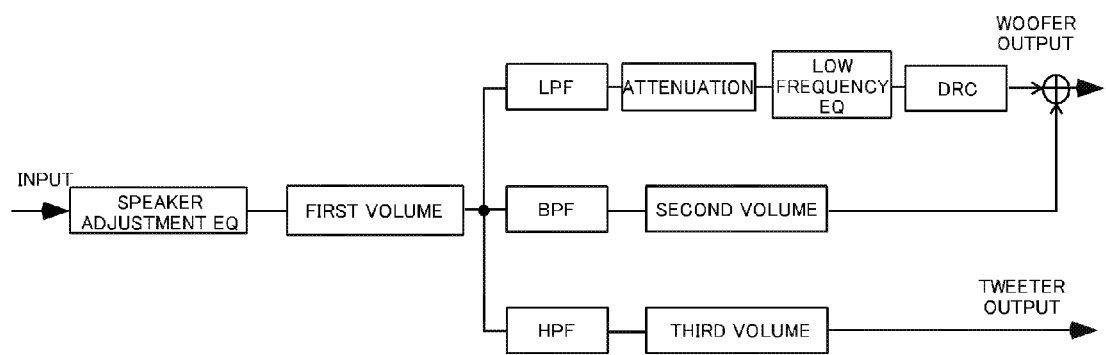
FIG. 9 is a diagram illustrating signal processing by the DSP in a second embodiment.

In a second embodiment, the speaker 7 is a 2 way speaker that includes a tweeter and a woofer. FIG. 9 is a diagram illustrating signal processing by the DSP in the second embodiment. As illustrated in FIG. 9, the DSP 4 performs the speaker EQ adjustment processing, the LPF processing, the attenuation processing, the low frequency EQ processing, the DRC processing, band pass filter processing (hereinafter referred as to "BPF processing", the second volume processing, the synthesis processing, and third volume processing. Description is omitted with regard to the same processing as the first embodiment.

The BPF processing is processing to extract a predetermined band component (for example, not less than 150 Hz and not more than 3 kHz) of the audio signal. The DSP 4 performs the BPF processing to the audio signal to which the first volume processing is performed. The second volume processing is processing to attenuate the audio signal based on volume value that is received by the microcomputer 2. The DSP 4 performs the second volume processing to the audio signal to which the BPF processing is performed. The synthesis processing is processing to synthesize the audio signal to which the DRC processing is performed and the audios signal to which the second volume processing is performed. The DSP 4 synthesizes the audio signal to which the DRC processing is performed and the audios signal to which the second volume processing is performed. The audio signal to which the synthesis processing is performed is output to the woofer.

The HPF processing is processing to extract high frequency component (for example, not less than 3 kHz) of the audio signal. The DSP 4 performs the HPF processing to the audio signal to which the first volume processing is performed. The third volume processing is processing to attenuate the audio signal based on volume value that is received by the microcomputer 2. The DSP 4 performs the third volume processing to the audio signal to which the HPF processing is performed. Herein, attenuation amount in the second volume processing and the third volume processing is the same. Relationship between the first volume processing and the second volume processing and the third volume processing is the same as the first embodiment illustrated in FIG. 4. The audio signal to which the third volume processing is performed is output to the tweeter.

As described above, in the present embodiment, the DSP 4 performs the DRC processing to compress the audio signal to which the LPF processing is performed in case that the audio signal to which the LPF processing is performed is not less than the predetermined signal level. Thus, volume shortage of middle and high band can be resolved because middle and high frequency of the audio signal is not compressed wastefully.

Low frequency component of the audio signal is compressed in case of not less than the predetermined signal level so that amplitude of a speaker diaphragm does not reach failure point. However, the middle and high frequency component of the audio signal is not signal level to reach failure point even if attenuation amount by the first volume processing to attenuate all band component of the audio signal based on volume value that is received is zero. In the present embodiment, the DSP 4 performs second volume processing to attenuate the audio signal to which the BPF processing is performed based on volume value that is received. Further, the DSP 4 performs third volume processing to attenuate the audio signal to which the HPF processing is performed based on the volume value that is received. Therefore, volume shortage of middle and high frequency can be resolved because volume of middle and high frequency component of the audio signal can be risen (attenuation amount can be decreased).

Further, in the present embodiment, attenuation amount by the first volume processing is zero and the attenuation amount by the second volume processing and the third volume processing change in case that the volume value that is received exceeds the predetermined value. Therefore, middle and high frequency component of the audio signal can be risen (attenuation amount can be decreased) by the second volume processing and the third volume processing even if attenuation amount by the first volume processing becomes zero.

Further, in the first and second embodiments, the DSP 4 performs the low frequency equalizing processing to boost the low frequency component of the audio signal to which the LPF processing is performed. Thus, frequency characteristics of a speaker can be extended to low frequency.

Further, in the first and second embodiments, the DSP 4 performs the attenuation processing to attenuate the audio signal to which the LPF processing is performed. Thus, there can be margin in the middle and high frequency component of the audio signal compared with case where all band frequency component of the audio signal is attenuated because only the low frequency component of the audio signal is attenuated for the low frequency equalizing processing. Therefore, in the second volume processing, volume can be risen with the predetermined attenuation amount.

In the first and the second embodiments, attenuation amount by the attenuation processing is equal to value of difference of the attenuation amount by the first volume processing and the attenuation amount by the second volume processing in case where the volume value that is received is the predetermined value. Thus, in case that the volume value that is received changes beyond the predetermined value, audio that the low frequency component and the middle and high frequency of the audio signal is balanced can be reproduced.

Further, in the first and second embodiments, the DSP 4 performs the speaker adjustment equalizing processing to adjust frequency characteristics of the audio signal based on characteristics of the speaker. Thus, frequency characteristics can be set based on characteristics of the speaker.

Third Embodiment

In the first embodiment and the second embodiment, volume sense and stereo sense are trade-off relationship. Namely, when the first embodiment and the second embodiment are applied to stereo reproduction, there is a problem that volume sense of low frequency lacks.

Figure 10:
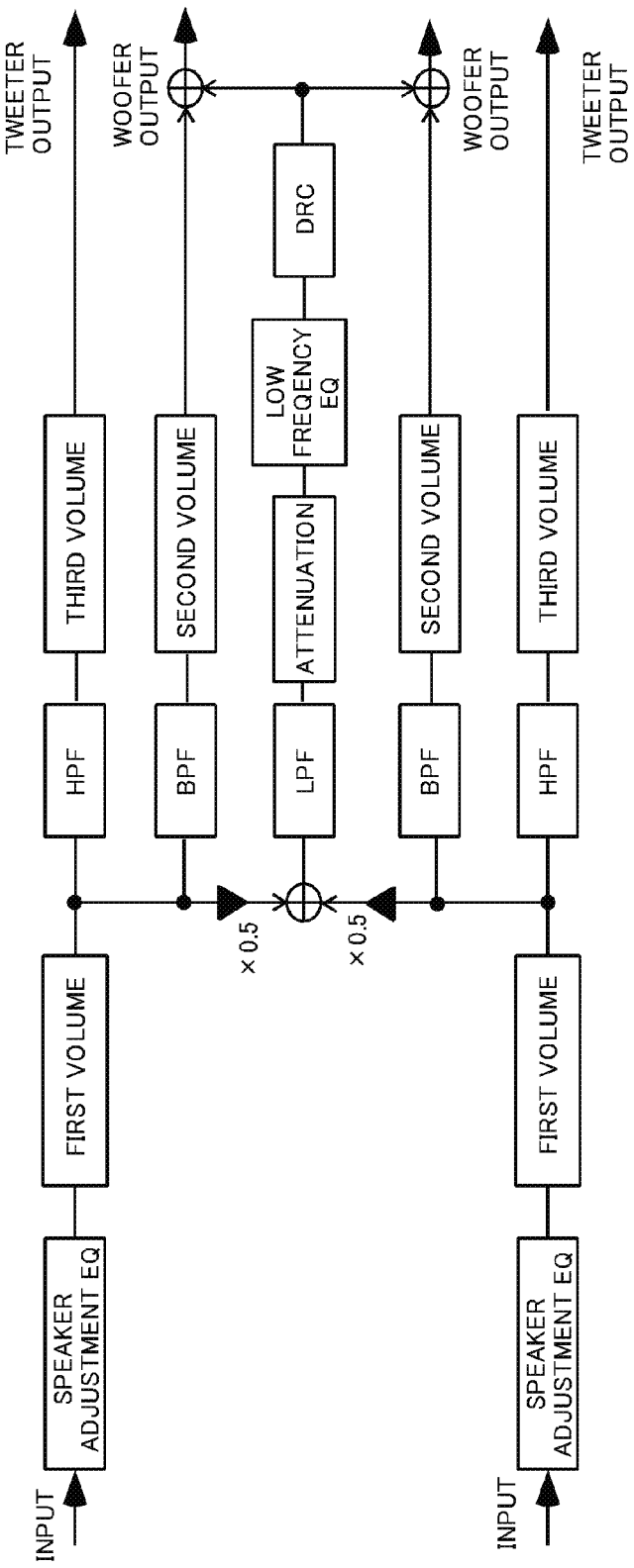
FIG. 10 is a diagram illustrating signal processing by the DSP in a third embodiment.

In a third embodiment, the speaker 7 is a 2 way speaker that includes tweeters and woofers. FIG. 10 is a diagram illustrating signal processing by the DSP in the third embodiment. As illustrated in FIG. 10, the DSP 4 performs the speaker adjustment EQ processing, the first volume processing, monaural synthesis processing, the LPF processing, the attenuation processing, the low frequency EQ processing, the DRC processing, the BPF processing, the second volume processing, the synthesis processing, the HPF processing, and the third volume processing. The DSP 4 performs signal processing to a left and right audio signal. In the same processing as the first embodiment and the second embodiment, description is omitted.

The DSP 4 performs the speaker adjustment EQ to the left and right audio signal. The DSP 4 performs the first volume processing to the left and right audio signal to which the speaker adjustment EQ processing is performed. The monaural synthesis processing is processing to synthesize the left audio signal to which the first volume processing is performed that is multiplied by 0.5 and the right audio signal to which the first volume processing is performed that is multiplied by 0.5. The DSP 4 performs the monaural synthesis processing to the left and right audio signal to which the first volume processing is performed. In the LPF processing, the DSP 4 extracts the low frequency component of the audio signal to which the monaural synthesis processing is performed. In the third embodiment, for example, the DSP 4 extracts the low frequency component not more than 150 Hz of the audio signal. The DSP 4 performs the attenuation processing to the audio signal to which the low pass filter processing is performed. The DSP 4 performs the low frequency EQ processing to the audio signal to which the attenuation processing is performed. The DSP 4 performs the DRC processing to the audio signal to which the low frequency EQ processing is performed.

The DSP 4 performs the HPF processing to the left and right audio signal to which the first volume processing is performed. In the third embodiment, for example, the DSP 4 extracts the high frequency component not less than 300 Hz of the audio signal. The DSP 4 performs the BPF processing to the left and right audio signals to which the first volume processing is performed. In the third embodiment, the DSP 4 extracts frequency band component between not less than 150 Hz and not more than 300 Hz of the audio signal. The DSP 4 performs the second volume processing to the right and left audio signals to which the BPF processing is performed. The DSP 4 performs the third volume processing to the left and right audio signal to which the HPF processing is performed. The left and right audio signals to which the third volume processing is performed are output to the tweeters respectively.

In the synthesis processing, the DSP 4 synthesizes the audio signal to which the DRC processing is performed and the left audio signal to which the second volume processing is performed and synthesizes the audio signal to which the DRC processing is performed and the right audio signal to which the second volume processing is performed. The audio signal to which the synthesis processing is performed is output to the two woofers.

Figure 11:
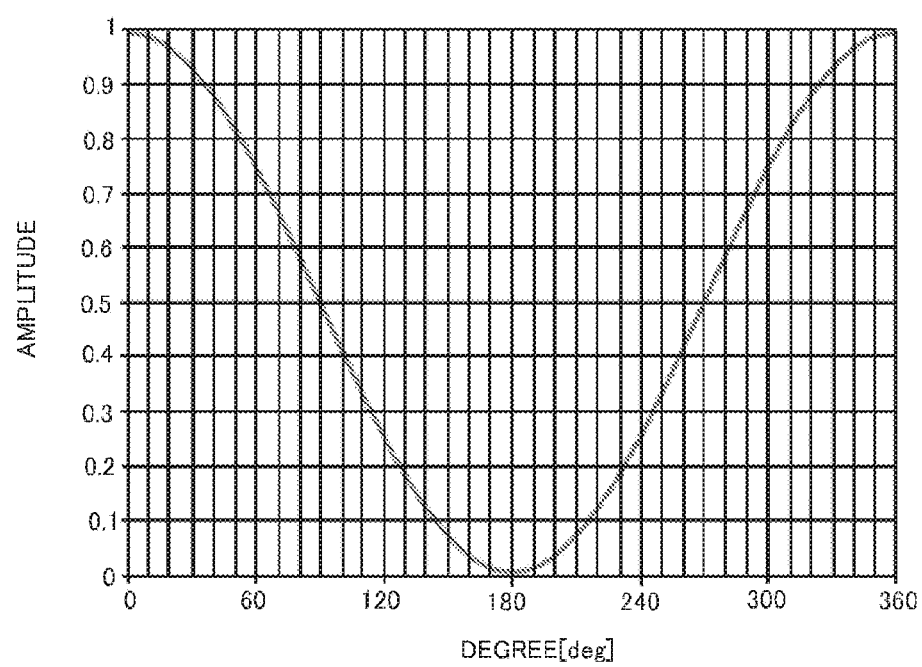
FIG. 11 is a graph illustrating an audio signal to which monaural synthesis processing is performed.
Figure 12:
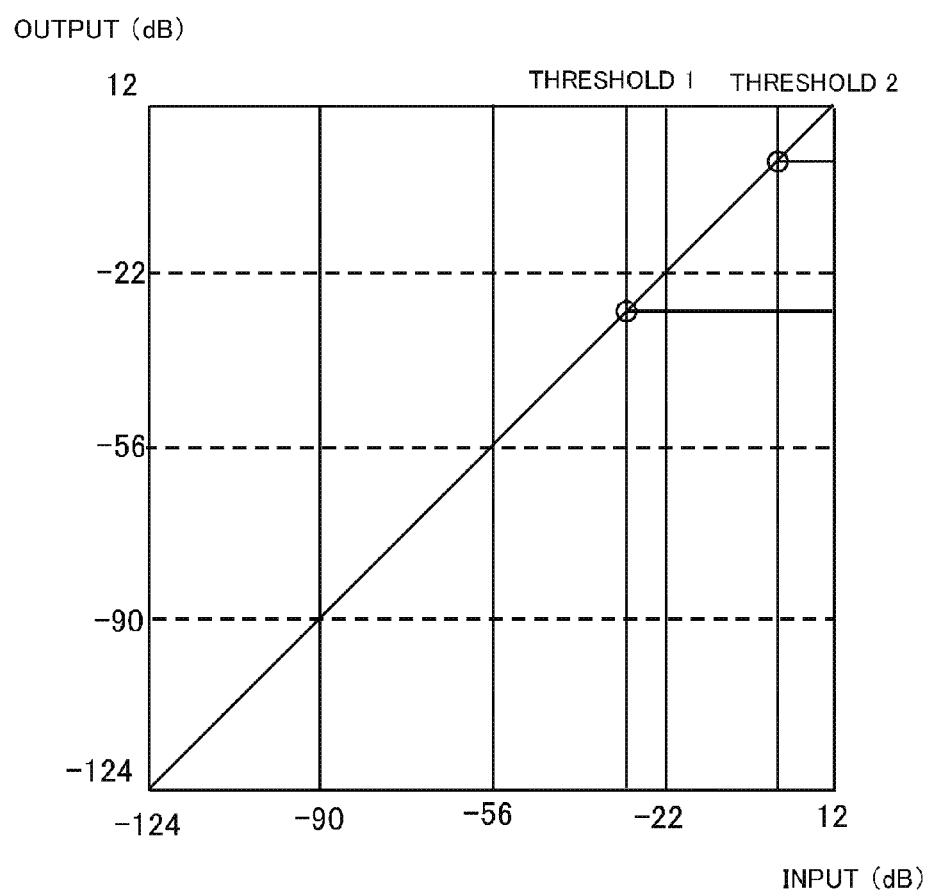
FIG. 12 is a graph illustrating compression processing by a signal processing device.
Figure 13:
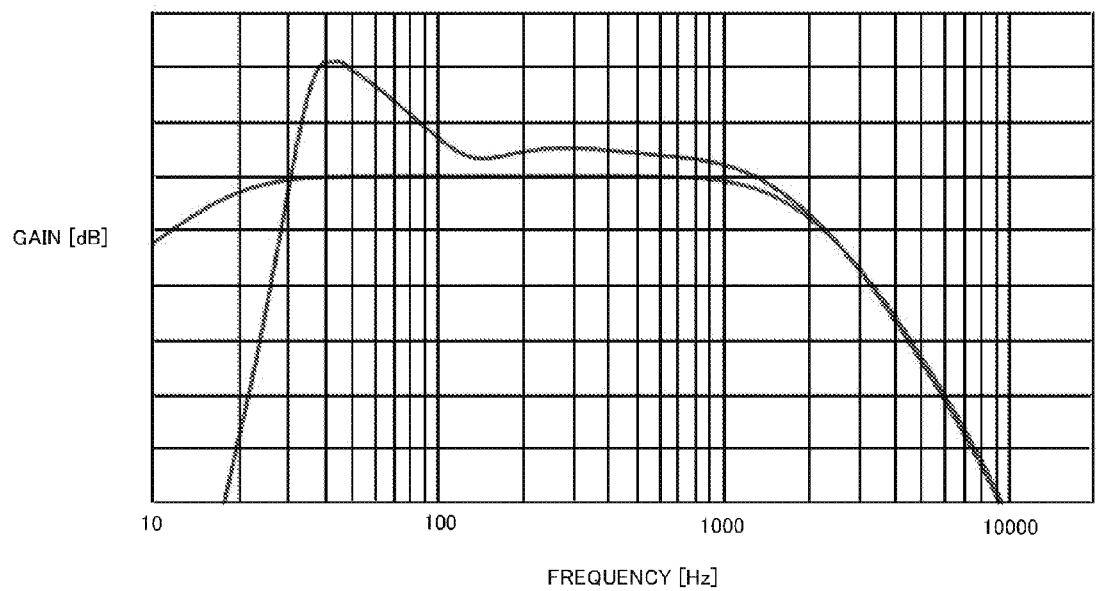
FIG. 13 is a diagram illustrating an audio signal that low frequency equalizing processing is performed.

FIG. 11 is a graph illustrating the audio signal to which the monaural processing is performed. A vertical axis illustrates amplitude and a horizontal axis illustrates degree. As described above, the monaural synthesis processing synthesizes (L/2+R/2) the left audio signal to which the first volume processing is performed that is multiplied by 0.5 (L/2) and the right audio signal to which the first volume processing is performed that is multiplied by 0.5 (R/2). As illustrated in FIG. 11, the more phase of L/R shifts, the more the signal level decreases. Reverse phase component completely disappears. In a one box speaker, there are few adverse effects of preliminary monaural synthesis because reverse phase low frequency signal disappears depending on length of wavelength by spatial synthesis. Meanwhile, in the audio signal not less than 150 Hz, adverse effect is strong by cancellation of reverse phase component. For this reason, in band that the same units bear, stereo sense is obtained by leaving the left and right (stereo) audio signals.

As described above, in the present embodiment, the LPF processing is performed to the audio signal that synthesizes the left signal to which the first volume processing is performed that is multiplied by 0.5 and the right signal to which the first volume processing is performed that is multiplied by 0.5. Namely, low frequency component of the monauralized audio signal is extracted. Further, the low frequency component of the audio signal and a predetermined frequency band component of the left audio signal are synthesized, and the low frequency component of the audio signal and a predetermined frequency band component of the right audio signal are synthesized. By outputting the synthesized audio signal to the two woofers and outputting the high frequency component of the left and right audio signal to the two tweeters, the audio signal not less than predetermined frequency is stereo and the audio signal not more than predetermined frequency is monauralized. For this reason, volume sense of low sound can be secured, burden of each unit/amplifier can be spread, and stereo sense can be obtained. Like this, according to the present embodiment, volume sense and stereo sense can be compatible.

The embodiment of the present invention is described above, but the mode to which the present invention is applicable is not limited to the above embodiment and can be suitably varied without departing from the scope of the present invention.

In the above described embodiment, each processing such as the first volume processing is performed by the DSP 4. Not limited to this, each processing may be performed by a dedicated circuit.

The present invention can be suitably employed in a signal processing device that performs signal processing to an audio signal, a signal processing method, and a speaker device that includes the signal processing device.

What is claimed is:

1. A signal processing device performing:
   first volume processing to attenuate an audio signal based on a volume value that is received,
   low pass filter processing to extract low frequency component of the audio signal to which the first volume processing is performed,
   compression processing to compress the audio signal to which the low pass filter processing is performed in case that the audio signal to which the low pass filter processing is performed is not less than a predetermined signal level,
   high pass filter processing to extract high frequency component of the audio signal to which the first volume processing is performed,
   second volume processing to attenuate the audio signal to which the high pass filter processing is performed based on the volume value that is received, and
   synthesis processing to synthesize the audio signal to which the compression processing is performed and the audio signal to which the second volume processing is performed.

2. The signal processing device according to claim 1, wherein attenuation amount by the first volume processing changes and attenuation amount by the second volume processing are constant in case that the volume value that is received is not more than a predetermined value, and
   the attenuation amount by the first volume processing is zero and the attenuation amount by the second volume processing changes in case that the volume value that is received exceeds the predetermined value.

3. A signal processing device performing:
   first volume processing to attenuate an audio signal based on a volume value that is received,
   low pass filter processing to extract low frequency component of the audio signal to which the first volume processing is performed,
   compression processing to compress the audio signal to which the low pass filter processing is performed in case that the audio signal to which the low pass filter processing is performed is not less than a predetermined signal level,
   high pass filter processing to extract high frequency component of the audio signal to which the first volume processing is performed,
   band pass filter processing to extract frequency band component between the low frequency component and the high frequency component of the audio signal to which the first volume processing is performed,
   second volume processing to attenuate the audio signal to which the band pass filter processing is performed based on the volume value that is received,
   third volume processing to attenuate the audio signal to which the high pass filter processing is performed based on the volume value that is received, and
   synthesis processing to synthesize the audio signal to which the compression processing is performed and the audio signal to which the second volume processing is performed.

4. The signal processing device according to claim 3, wherein attenuation amount by the first volume processing changes and attenuation amount by the second volume processing and the third volume processing is constant in case that the volume value that is received is not more than a predetermined value, and
   the attenuation amount by the first volume processing is zero and the attenuation amount by the second volume processing and the third volume processing changes in case that the volume value that is received exceeds the predetermined value.

5. The signal processing device according to claim 1 further performing:
   low frequency equalizing processing to boost the low frequency component of the audio signal to which the low pass filter processing is performed, and
   wherein the compression processing is performed to the audio signal to which the low frequency equalizing processing is performed.

6. The signal processing device according to claim 5 further performing:
   attenuation processing to attenuate the audio signal to which the low pass filter processing is performed, and
   wherein the low frequency equalizing processing is performed to the audio signal to which the attenuation processing is performed.

7. The signal processing device according to claim 6, wherein attenuation amount by the attenuation processing is equal to a value of a difference of the attenuation amount by the first volume processing and the attenuation amount by the second volume processing in case where the volume value that is received is a predetermined value.

8. The signal processing device according to claim 6 further performing:
   speaker adjustment equalizing processing to adjust frequency characteristics of the audio signal based on characteristics of a speaker, and
   the first volume processing to the audio signal to which the speaker adjustment equalizing processing is performed.

9. The signal processing device according to claim 3, wherein
   in the first volume processing, a left and right audio signal is attenuated based on the volume value that is received, further performing:
monaural synthesis processing to synthesize a left audio signal to which the first volume processing is performed that is multiplied by 0.5 and a right audio signal to which the first volume processing is performed that is multiplied by 0.5,
in the low pass filter processing, low frequency component of an audio signal to which the monaural synthesis processing is performed is extracted,
in the compression processing, the audio signal to which the low pass filter processing is performed is compressed in case that the audio signal to which the low pass filter processing is performed is not less than a predetermined signal level,
in the high pass filter processing, high frequency component of the left and right audio signals to which the first volume processing is performed is extracted,
in the band pass filter processing, frequency band component between the low frequency component and the high frequency component of the left and right audio signals to which the first volume processing is performed is extracted,
in the second volume processing, the left and right audio signals to which the band pass filter processing is performed are attenuated based on the volume value that is received,
in the third volume processing, the left and right audio signals to which the high pass filter processing is performed are attenuated based on the volume value that is received,
and in the synthesis processing, the audio signal to which the compression processing is performed and a left audio signal to which the second volume processing is performed are synthesized and the audio signal to which the compression processing is performed and a right audio signal to which the second volume processing is performed are synthesized.

10. The signal processing device according to claim 9, wherein
the left and right audio signals to which the third volume processing is performed are output to tweeters respectively, and
the audio signal to which the synthesis processing is performed is output to two woofers.

11. A speaker device comprising:
the signal processing device according to claim 1, and
a speaker into which the audio signal synthesized by the synthesis processing is input.

12. A signal processing method performing:
first volume processing to attenuate an audio signal based on a volume value that is received,
low pass filter processing to extract low frequency component of the audio signal to which the first volume processing is performed,
compression processing to compress the audio signal to which the low pass filter processing is performed in case that the audio signal to which the low pass filter processing is performed is not less than a predetermined signal level,
high pass filter processing to extract high frequency component of the audio signal to which the first volume processing is performed,
second volume processing to attenuate the audio signal to which the high pass filter processing is performed based on the volume value that is received, and
synthesis processing to synthesize the audio signal to which the compression processing is performed and the audio signal to which the second volume processing is performed.

13. A signal processing method performing:
first volume processing to attenuate an audio signal based on a volume value that is received,
low pass filter processing to extract low frequency component of the audio signal to which the first volume processing is performed,
compression processing to compress the audio signal to which the low pass filter processing is performed in case that the audio signal to which the low pass filter processing is performed is not less than a predetermined signal level,
high pass filter processing to extract high frequency component of the audio signal to which the first volume processing is performed,
band pass filter processing to extract frequency band component between the low frequency component and the high frequency component of the audio signal to which the first volume processing is performed,
second volume processing to attenuate the audio signal to which the band pass filter processing is performed based on the volume value that is received,
third volume processing to attenuate the audio signal to which the high pass filter processing is performed based on the volume value that is received, and
synthesis processing to synthesize the audio signal to which the compression processing is performed and the audio signal to which the second volume processing is performed.

14. The signal processing device according to claim 13, wherein
in the first volume processing, left and right audio signals are attenuated based on the volume value that is received,
further performing:
monaural synthesis processing to synthesize a left audio signal to which the first volume processing is performed that is multiplied by 0.5 and a right audio signal to which the first volume processing is performed that is multiplied by 0.5,
in the low pass filter processing, low frequency component of an audio signal to which the monaural synthesis processing is performed is extracted,
in the compression processing, the audio signal to which the low pass filter processing is performed is compressed in case that the audio signal to which the low pass filter processing is performed is not less than a predetermined signal level,
in the high pass filter processing, high frequency component of the left and right audio signals to which the first volume processing is performed is extracted,
in the band pass filter processing, frequency band component between the low frequency component and the high frequency component of the left and right audio signals to which the first volume processing is performed is extracted,
in the second volume processing, the left and right audio signals to which the band pass filter processing is performed are attenuated based on the volume value that is received,
in the third volume processing, the left and right audio signals to which the high pass filter processing is performed are attenuated based on the volume value that is received, and in the synthesis processing, the audio signal to which the compression processing is performed and a left audio signal to which the second volume processing is performed are synthesized and the audio signal to which the compression processing is performed and a right audio signal to which the second volume processing is performed are synthesized.

* * * * *